(12) United States Patent
Son et al.

(10) Patent No.: US 6,358,805 B2
(45) Date of Patent: *Mar. 19, 2002

(54) METHOD OF MAKING A SOI DEVICE HAVING FIXED CHANNEL THRESHOLD VOLTAGE

(75) Inventors: Jeong-Hwan Son, Taejeon; Hyeong-Mo Yang, Seoul, both of (KR)

(73) Assignee: LG Semicon Co., Ltd., Chungcheongbuk-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/114,934

(22) Filed: Jul. 14, 1998

(30) Foreign Application Priority Data

Jul. 14, 1997 (KR) .............................. 97-32608

(51) Int. Cl.[7] .............................. H01L 23/336
(52) U.S. Cl. ................. 438/305; 438/149; 438/151; 438/152; 438/162; 438/163; 438/164; 438/289; 438/291
(58) Field of Search ................. 438/151, 163, 438/149, 152, 162, 164, 564, 289, 291, 305

(56) References Cited

U.S. PATENT DOCUMENTS

| | | | |
|---|---|---|---|
| 5,241,211 A | * | 8/1993 | Tashiro |
| 5,365,080 A | * | 11/1994 | Yamazaki |
| 5,532,175 A | * | 7/1996 | Racanelli |
| 5,545,571 A | * | 8/1996 | Yamazaki |
| 5,719,081 A | * | 2/1998 | Racanelli |
| 5,854,494 A | * | 12/1998 | Yamazaki |
| 5,917,219 A | * | 6/1999 | Nandakumar et al. |

OTHER PUBLICATIONS

Thomas et al., P–poly and n–poly gate ulta–fine film SIMOX transistors, IEEE, pp. 130–131, 1989.*
Sherony, et al, "Reduction of Threshold Voltage Sensitivity in SOI MOSFET's," IEEE Electron Device Letters, vol., 16. No. 3, Mar. 1995, Pages (cover page) and 100–102.

* cited by examiner

Primary Examiner—Long Pham
Assistant Examiner—Scott Brairton

(57) ABSTRACT

In a semiconductor device and method for manufacturing the same, a buried insulating layer is formed on a semiconductor substrate, multiple depletion regions of a first conductivity type are formed on the buried insulating layer and separated from one another, a field oxide layer is formed among the depletion regions of the buried insulating layer, a gate oxide layer is formed on the depletion regions, a gate is formed on the gate oxide layer, impurity regions that are heavily doped with impurities of a second conductivity type is formed in the depletion regions on both sides of the gate to define a source and drain, and a counter doping layer that is lightly doped with impurities of the second conductivity type is formed under the channel defined by a portion of the depletion regions positioned between the impurity regions. The counter doping layer is formed at a predetermined or fixed distance from the upper surface of the depletion region defining the channel, overlapping the lower portion of the depletion region to achieve uniform thickness in at least a portion of the depletion region.

15 Claims, 4 Drawing Sheets

METHOD OF MAKING A SOI DEVICE HAVING FIXED CHANNEL THRESHOLD VOLTAGE

BACKGROUND OF THE INVENTION

1. Field of the Invention

The present invention relates to a semiconductor device and fabrication method, and more specifically, to a semiconductor device and fabrication method by which adjacent elements are insulated from one another by a buried insulating layer.

2. Description of Related Art

With advancements in large-scale integration of semiconductor devices, the distance between adjacent elements has become shorter. However, reducing the distance between adjacent elements can result in unwanted electrical junctions between the elements. For example, a latch-up may result from the formation of a parasitic bipolar junction transistor between NMOS and PMOS elements in a CMOS (Complementary Metal Oxide Semiconductor) device.

To overcome this problem, semiconductor devices have been designed with a SOI (Silicon On Insulator) structure. In a SOI structure, an insulating layer is formed on a semiconductor substrate, and a thin single crystal silicon layer is formed on the insulating layer. The thin single crystal silicon layer is used as a depletion region.

A semiconductor device having an SOI structure can be made by using an SIMOX (Separation by Implanted Oxygen) or BESOI (Bonded and Etchback SOI) substrate. To form the SIMOX substrate, impurities such as oxygen (O$_2$) or nitrogen (N$_2$) are ion-implemented into a semiconductor substrate to form a buried insulating layer. The BESOI substrate is produced by melting two semiconductor substrates having an insulating layer consisting of Si$_3$O$_2$, Si$_3$N$_4$ or the like, and etching the combined substrate to a desired thickness.

As described above, the semiconductor device having an SOI structure can avoid unwanted electrical junctions between elements, such as the formation of a parasitic bipolar transistor, by isolating the semiconductor substrate from the single crystal silicon layer with an insulating layer to obtain pn-junction protection.

FIG. 1 is a cross section of a semiconductor device in accordance with the prior art.

Referring to FIG. 1, a buried insulating layer 13 is formed on a semiconductor substrate 11, and depletion regions 15 (300 to 1500 Å thick) doped with p-type impurities are formed on the buried insulating layer 13. The buried insulating layer 13 and the depletion regions 15 form an SOI structure. Layer 13 and region 15 are prepared by either an SIMOX (Silicon On Insulator) or a BE (Bonded and Etchback) method. If they are made by the SIMOX method, the semiconductor substrate 11 is p-type which is the same conductivity type as the depletion regions 15. When produced using a BE method, the semiconductor substrate 11 may be p-type or n-type, irrespective of the conductivity type of depletion regions 15.

A field oxide layer 17 defines the active region of elements and is formed in the depletion regions 15. Field oxide layer 17 contacts the buried insulating layer 13, rendering field oxide layer 17 electrically isolated from active regions adjacent to the active region of the element comprising the depletion regions 15. A gate oxide layer 19 is formed on the depletion regions 15. Gate 21 is formed on the gate oxide layer 19. Both sides of the gate 21, which is formed in the depletion regions 15, are heavily doped with n-type impurities, such as arsenic (As), antimony (Sb) or phosphorus (P), to form an impurity region 23 that will function as source and drain regions. The depletion regions 15 between the impurity regions 23 will become a channel.

Because the above-described semiconductor device has depletion regions 15 on the buried insulating layer 13 that are between 300 to 1500 Å thick, applying OV to the gate 21 will determine the threshold voltage by depicting the channel comprising the depletion regions 15 under the gate 21.

FIGS. 2A–2C are flow diagrams illustrating a process for fabricating semiconductor devices according to prior art.

Referring to FIG. 2A, p-type depletion regions 15 are formed on the buried insulating layer 13 of a semiconductor substrate 11 having thickness of between 300 and 1500 Å. A field oxide layer 17, defining the active regions of elements, is formed in predetermined portions on the depletion regions 15 by LOCOS (Local Oxidation of Silicon). The field oxide layer 17 is in contact with the buried insulating layer 13. The buried insulating layer 13 and the depletion regions 15 are formed on the semiconductor substrate 11 using either SIMOX or BE methods. When the buried insulating layer 13 and the depletion regions 15 are made using the SIMOX method, the semiconductor substrate 11 is p-type, which is the same conductivity type as depletion regions 15. If made using the BE method, the semiconductor substrate 11 can be either p-type or n-type, irrespective of the depletion regions 15.

Referring to FIG. 2B, a gate oxide layer 19 is formed on the surface of the depletion regions 15 by heat oxidation. In addition, doped amorphous silicon or polysilicon is deposited on the field oxide layer 17 and the gate oxide layer 19 by chemical vapor deposition (hereinafter, referred to as "CVD"). Following the CVD, the amorphous silicon or polysilicon layer is patterned using a photolithographic process to leave only a predetermined portion on the depletion regions 15, thereby producing gate 21.

Referring to FIG. 2C, the depletion regions 15 are heavily doped with n-type impurities, such as arsenic (As), phosphorus (P) or the like. During their formation, gate 21 is used as a mask to create an impurity region 23 that will function as source and drain regions. The depletion regions 15 between the impurity regions 23 will become a channel.

In a conventional semiconductor device as described above, the buried insulating layer and the depletion regions are formed on the semiconductor substrate using the BE method. Thus, the depletion regions may not be uniform in thickness after an etchback process. Variations in the thickness of the depletion regions cause the capacitance of the depletion regions to be varied. Consequently, the threshold voltage of the channel is not constant. As the depletion regions become thinner, variations in the thickness of the depletion regions increase the variations in the threshold voltage of the channel to a greater degree.

SUMMARY OF THE INVENTION

An object of the present invention is to solve the problem described above and to create a semiconductor device and its fabrication method. This object is accomplished by making the threshold voltage of the channel constant, irrespective of the thickness of the depletion regions, thereby preventing the deterioration of element characteristics.

Another object of the present invention is to provide a semiconductor device having a constant channel threshold voltage, and its fabrication method.

To achieve these and other objects and advantages, and in accordance with the present invention, a semiconductor device includes a semiconductor substrate, a depletion region positioned above the semiconductor substrate, a buried insulating layer positioned between the semiconductor substrate and the depletion region, a field oxide layer positioned above the buried insulating layer and adjacent to the depletion region, a gate positioned above the first depletion region, a gate oxide layer positioned between the depletion region and the gate, impurity regions positioned on both sides of the gate, and a counter doping layer positioned under the channel of the depletion region.

In addition, the present invention includes a method of manufacturing a semiconductor device, including the steps of forming a buried insulating layer on a semiconductor substrate, forming a depletion region above the semiconductor substrate and above the buried insulating layer, forming a field oxide layer in a predetermined portion of the depletion region, forming a gate oxide layer on a surface of the depletion region, forming a gate on the field oxide layer and above the depletion region, forming impurity regions in the depletion region, and forming a counter doping layer between at least a portion of the depletion region and the semiconductor substrate. In this method, impurities are implanted into the buried insulating layer based on a projected range of an implant profile positioned on the buried insulating layer.

In either instance, the impurity regions define source and drain regions, and a portion of the depletion region positioned between the impurity regions defines a channel region. An upper edge of the counter doping layer and an upper edge of at least the portion of the depletion region defining the channel region are uniformly spaced. The counter doping layer is positioned a fixed distance below all or some of a surface of the first depletion region, overlapping at least a portion of the depletion region to achieve uniform thickness in the depletion region. The depletion region is doped with impurities of a first conductivity type, and the impurity regions are doped with impurities of a second conductivity type. The counter doping layer is formed by ion-implanting impurities ranging from $5 \times 10^{11}$ to $5 \times 10^{12}/cm^2$ at an energy ranging from 20 to 80 KeV when formed before the gate, or ranging from between $1 \times 10^{16}$ to $1 \times 10^{17}/cm^3$ at an energy ranging from 100 to 300 KeV when formed after the gate.

Further scope of applicability of the present invention will become apparent from the detailed description given hereinafter. However, it should be understood that the detailed description and specific examples, wile indicating preferred embodiments of the invention, are given by way of example only, since various changes and modifications within the spirit and scope of the invention will become apparent to those skilled in the art from this detailed description.

BRIEF DESCRIPTION OF THE ATTACHED DRAWINGS

The accompanying drawings, which are included to provide a further understanding of the invention and are incorporated in and constitute a part of this specification, illustrate embodiments of the invention that serve to explain the principles of the invention together with their description and wherein.

DETAILED DESCRIPTION OF THE PREFERRED EMBODIMENTS

Reference will now be made in detail to the preferred embodiments of the present invention, examples of which are illustrated in FIGS. 3–5B.

Figure 1:
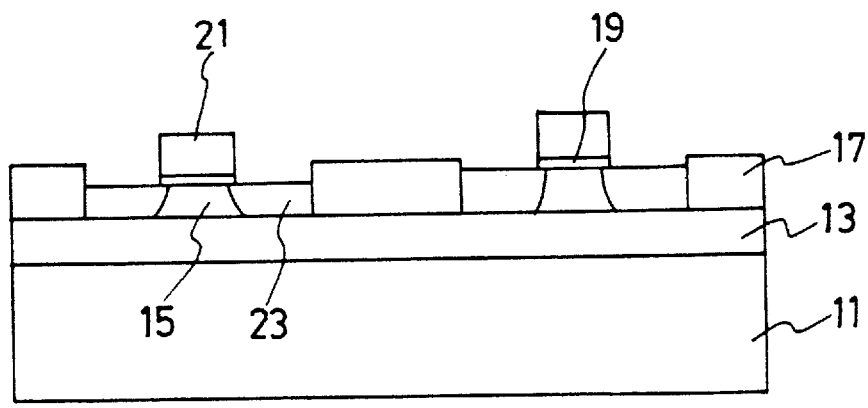
FIG. 1 is a cross section of a semiconductor device in accordance with the prior art.
Figure 2A:
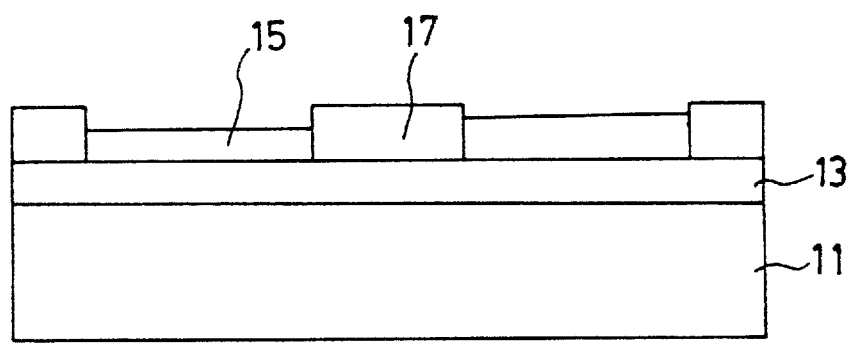
FIGS. 2A–2C are flow diagrams of the fabrication process of a semiconductor device in accordance with the prior art.
Figure 2B:
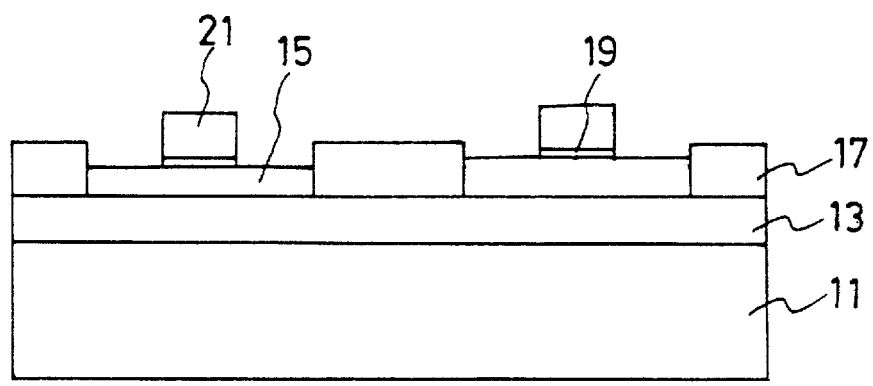
Figure 2C:
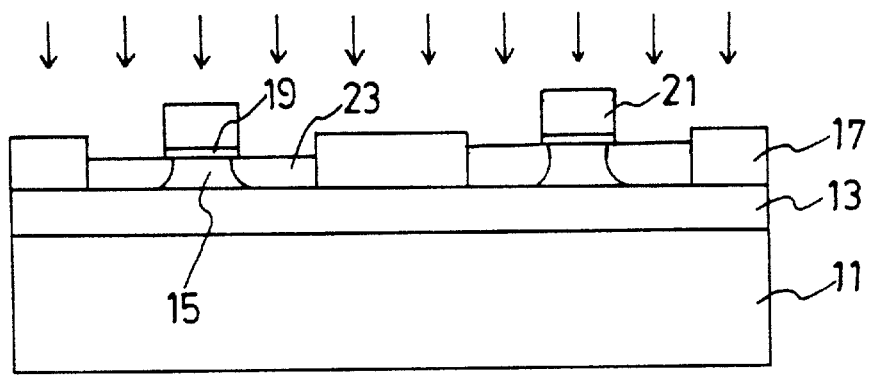
Figure 3:
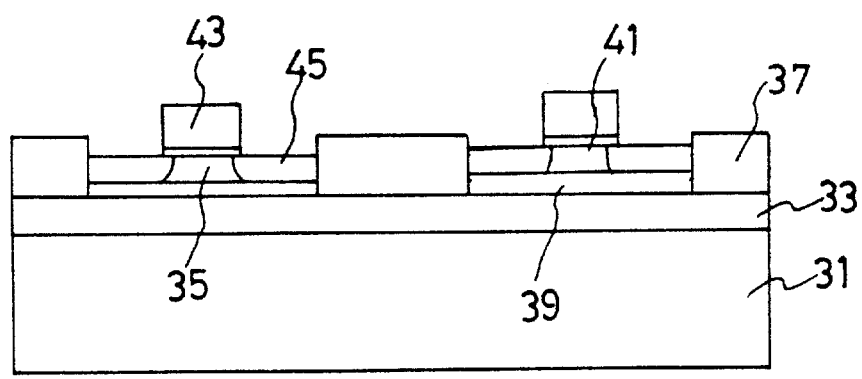
FIG. 3 is a cross section of a semiconductor device in accordance with the present invention.

FIG. 3 is a cross section of a semiconductor device in accordance with the present invention.

Referring to FIG. 3, a buried insulating layer 33 is formed on a semiconductor substrate 31. Depletion regions 35 are formed on the buried insulating layer 33 with a thickness of 300 to 1500 Å, and doped with p-type impurities. The buried insulating layer 33 and the depletion regions 35 form a SOI structure. They are formed using either a SIMOX or BE method. When they are formed using a SIMOX method, the semiconductor substrate 31 has p-type conductivity, which is the same conductivity type as depletion regions 35. When formed using a BE method, the semiconductor substrate 31 can be either p-type or n-type, irrespective of the conductivity type of depletion regions 35. The depletion regions 35 can be doped with p-type or n-type impurities.

A field oxide layer 37 that defines the active region of the element is formed among the depletion regions 35. The field oxide layer 37 contacts the buried insulating layer 33, electrically insulating active regions on either side of that field oxide layer 37. Gate oxide layer 41 is formed on the depletion regions 35, and a Gate 43 is formed on gate oxide layer 41.

The portions of depletion regions 35 on either side of gate 43 are heavily doped with n-type impurities such as arsenic (As), antimony (Sb), phosphorus (P) or the like. These regions form impurity regions 45 that will function as source and drain regions. The portion of the depletion regions 35 functions as a channel.

Under the channel of the depletion region 35, a counter doping layer 39 is formed. Counter doping layer 39 is lightly doped with up to $1 \times 10^{16} \sim 1 \times 10^{17}/cm^3$, of n-type impurities such as phosphorous (P) or arsenic (As). The counter doping layer 39 contacts the buried insulating layer 33. In the above semiconductor device having the SOI structure, the depletion region 35 may be formed having a non-uniform thickness, such that the amount of the impurities within depletion region 35 becomes non-uniform. To ensure uniformity in the thickness of depletion region 35, counter doping layer 39 is positioned with a uniform depth from the surface of depletion region 35. Therefore, the thickness of depletion region 35 is limited by the top surface of counter doping layer 39. Thus, the entire depletion region has a uniform thickness, resulting in a uniform dispersion of impurities within depletion region 35 and causing the capacitance and threshold voltage to be constant.

FIGS. 4A–4D are diagrams of a process for fabricating the semiconductor device in accordance with a preferred embodiment of the present invention.

Figure 4A:
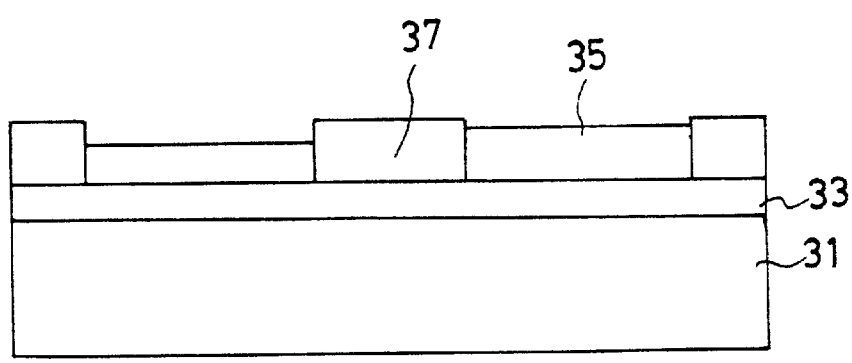
FIGS. 4A–4D are diagrams of the fabrication process for a semiconductor device in accordance with a preferred embodiment of the present invention.

Referring to FIG. 4A, p-type depletion regions 35 are formed on a buried insulating layer 33 of a semiconductor substrate 31 with a thickness of between 300 and 1500 Å. A field oxide layer 37 defines the active regions of elements. It is formed on predetermined portions of the depletion regions 35 by LOCOS (Local Oxidation of Silicon). The field oxide layer 37 contacts the buried insulating layer 33, electrically insulating active regions on either side of that field oxide layer 37.

The buried insulating layer 33 and the depletion regions 35 are formed using either SIMOX or BE method. When formed using a SIMOX method, the semiconductor substrate 31 is p-type conductivity, the same as the conductivity type of the depletion regions 35. When formed using a BE method, the semiconductor substrate 31 can have either p-type or n-type conductivity, regardless of the conductivity type of the semiconductor substrate 31.

Figure 4B:
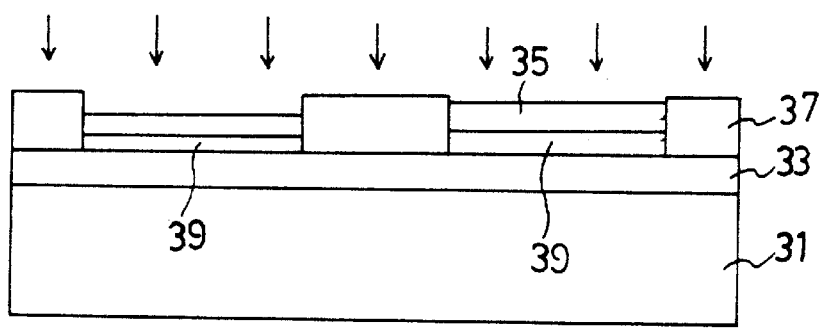

Referring to FIG. 4B, a counter doping layer 39 is formed under the depletion regions 35. To produce the counter doping layer 39, n-type impurities are ion-implanted based on the projected range Rp of an implant profile positioned in the buried insulating layer 33. The n-type impurities being implanted may include impurities such as phosphorous (P), arsenic (As) or the like. They are ion-implanted with an energy of 20~80 KeV. Following the ion-implantation, the implanted impurities are diffused by heat oxidation to form the counter doping layer 39 whose profile tail overlaps with the bottom portion of depletion regions 35.

Figure 4C:
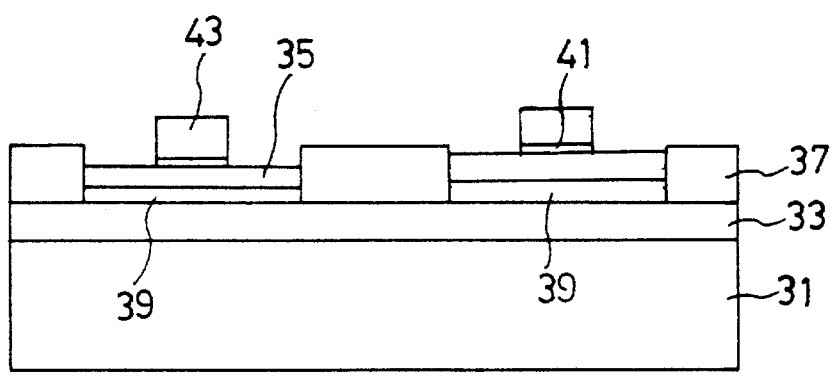

Referring to FIG. 4C, a gate oxide layer 41 is formed on the surface of the depletion regions 35 by heat oxidation. A doped amorphous silicon or polysilicon layer, which is 1500 to 3000 Å thick, is deposited on the field oxide layer 37 and the gate oxide layer 41 by a CVD method. A photolithographic process is used to pattern the doped amorphous silicon or polysilicon layer, effectively forming gate 43 by leaving only predetermined portions on the depletion regions 35.

Figure 4D:
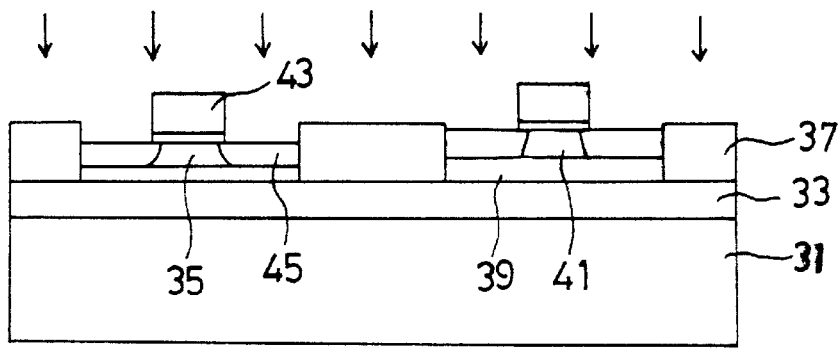

Referring to FIG. 4D, impurity regions 45 are formed by implanting ions into the depletion regions 35 using the gate 43 as a mask. During this process, as much as $1\times10^{14}$~$5\times10^{15}$/cm$^2$ of n-type of impurities, such as arsenic (As) or phosphorus (P), are ion-implanted with an energy of 20~50 KeV. The resulting impurity regions 45 function as source and drain regions. The portion of the depletion regions 35 between the impurity regions 45 functions as a channel.

Figure 5A:
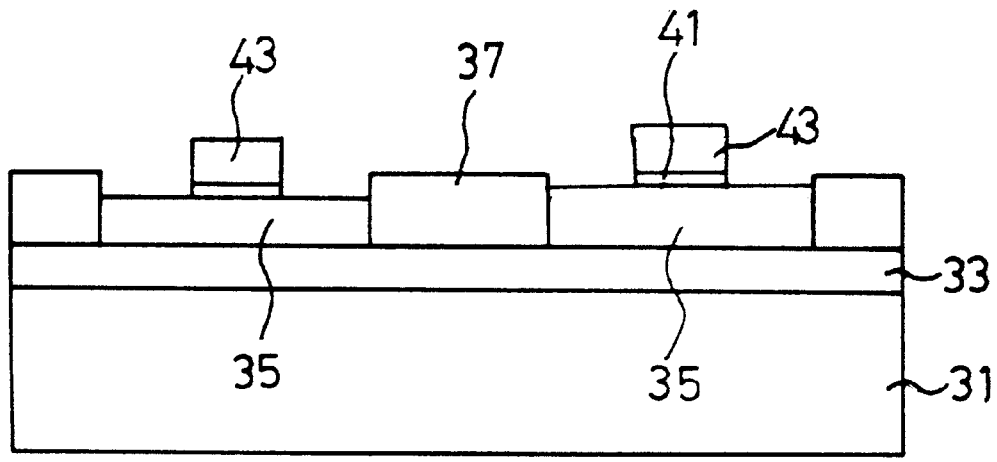
FIGS. 5A and 5B are diagrams of the fabrication process for a semiconductor device in accordance with another preferred embodiment of the present invention.
Figure 5B:
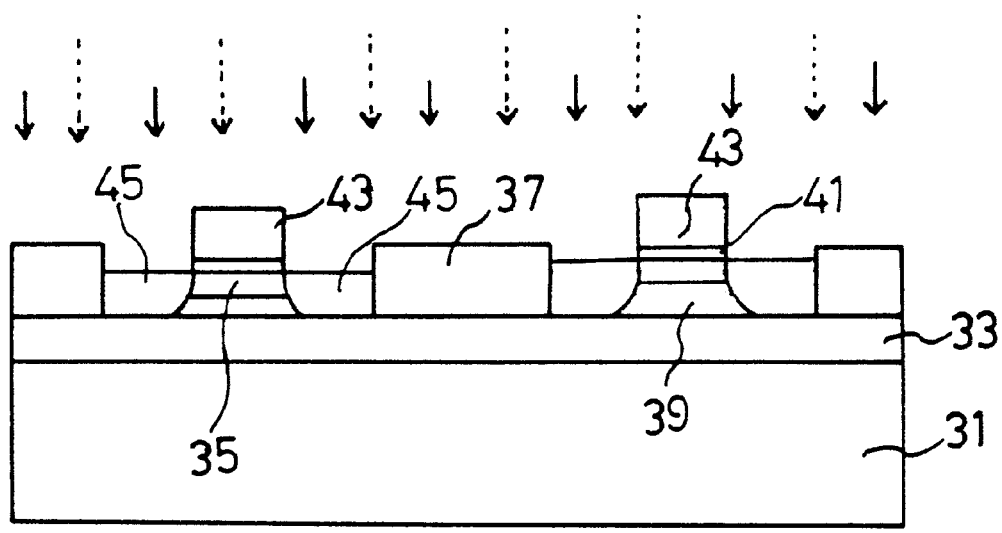

FIGS. 5A and 5B are diagrams of the fabrication process for the semiconductor device in accordance with another preferred embodiment of the present invention.

FIG. 5A illustrates the semiconductor device after the process shown in FIG. 4A is completed. In FIG. 5A, a gate oxide layer 41 is formed on the surface of the depletion regions 35 by heat oxidation. A doped amorphous silicon or polysilicon layer, which is between 1500 and 3000 Å thick, is deposited on the field oxide layer 37 and the gate oxide layer 41 by CVD method. A photolithographic process is used to pattern the doped amorphous silicon layer, effectively forming gate 43 by leaving only predetermined portions on the depletion regions 35.

Referring to FIG. 5B, impurity regions 45 are formed by implanting ions into the depletion region 35 using the gate 43 as a mask. During this process, up to $1\times10^{14}$~$5\times10^{15}$/cm$^2$ of n-type impurities, such as arsenic (As) or phosphorus (P), are ion-implanted with an energy of 20~50 KeV. The resulting impurity regions 45 function as source and drain regions. The portion of the depletion regions 35 between the impurity regions 45 functions as a channel.

After formation of the impurity region 45, a counter doping layer 39 is formed under the channel. To produce the counter doping layer 39, up to $5\times10^{11}$~$5\times10^{12}$/cm$^2$ of n-type impurities, such as phosphorous (P), arsenic (As) or the like, are implanted with an energy of 100~300 KeV, followed by diffusion by heat treatment. Because the impurity ions are implanted with energy of 100~300 KeV, the projected range Rp of the implant profile is positioned adjacent to the depletion regions 35 under the gate 43, but adjacent to the semiconductor substrate 31 of the buried insulating layer 33, and under the portion having no gate 43. Following heat treatment, the impurities around the semiconductor substrate 31 of the buried insulating layer 33 are not diffused across the depletion regions 35, while those around the depletion regions 35 of the buried insulating layer 33 are diffused across the depletion regions 35 by the gate 43. Accordingly, the profile tail of the counter doping layer 39 overlaps the lower portion of the depletion regions 35 under the gate 43.

As described in the foregoing, the counter doping layer 39 may be formed before or after the impurity regions 45.

Using the present invention, deterioration of element characteristics can be prevented by forming a depletion region having a uniform thickness, resulting from the counter doping layer, thereby making the threshold voltage constant.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

What is claimed is:

1. A method of manufacturing a semiconductor device comprising:
    forming a silicon-on-insulator (SOI) structure, the SOI structure comprising a substrate, an insulating layer on the substrate, and a depletion region on the insulating layer;
    uniformly implanting impurities into the insulating layer; and
    performing heat oxidation on the uniformly implanted impurities to change the lower portion of the depletion layer into a counter doping layer, the counter doping layer being formed to have a uniform upper surface.

2. The method of claim 1, wherein the uniform implanting of impurities is performed by using an implant profile positioned at a depth within the insulating layer.

3. A method of manufacturing a semiconductor device comprising:

forming an insulating layer on a semiconductor substrate;

forming a plurality of field oxide regions on portions of the insulating layer;

forming a depletion region on the insulating layer between the field oxide regions;

uniformly implanting impurities into the insulating layer and performing heat oxidation to change a lower portion of the depletion layer contacting the insulating layer into a counter doping layer, the counter doping layer being formed to have a uniform upper surface;

forming a gate oxide layer on the depletion region;

forming a gate electrode on the gate oxide layer;

forming impurity regions on both sides of the gate electrode, the impurity regions defining source and drain regions.

4. The method of claim 3, wherein the depletion region and the counter doping layer are formed by doping impurities of opposite conductivity type, respectively.

5. The method of claim 3, wherein the counter doping layer is formed before forming the gate by implanting impurities having a first density into the depletion region at a first energy level.

6. The method of claim 5, wherein the first density is $1 \times 10^{16} \sim 1 \times 10^{17}/cm^3$.

7. The method of claim 5, wherein the first energy level is 20~80 KeV.

8. The method of claim 3, wherein the counter doping layer is formed after forming the gate by implanting impurities having a second density into the depletion region at a second energy level.

9. The method of claim 8, wherein the second density is $5 \times 10^{11} \sim 5 \times 10^{12}/cm^3$.

10. The method of claim 8, wherein the second energy level is 100~300 KeV.

11. The method of claim 3, wherein the insulating layer and depletion region are formed by a separation-by-implanted-oxygen (SIMOX) method, and the semiconductor substrate has a p-type conductivity.

12. The method of claim 3, wherein the insulating layer and depletion region are formed by a bonded and etchback (BE) method, and the semiconductor substrate has a p-type or an n-type conductivity.

13. A method of manufacturing a semiconductor device comprising:

forming a silicon-on-insulator (SOI) structure, the SOI structure including a substrate, an insulating layer on the substrate and a depletion region having a first conductivity type on the insulating layer; and forming a counter doping layer in the depletion region, the counter doping layer having a second conductivity type different from the first conductivity type.

14. The method of claim 13, wherein the first conductivity type is P-type and the second conductivity type is N-type.

15. The method of claim 13, wherein the first conductivity type is N-type and the second conductivity type is P-type.

* * * * *